(12) United States Patent
Xiao

(10) Patent No.: US 9,818,844 B2
(45) Date of Patent: Nov. 14, 2017

(54) HIGH-VOLTAGE JUNCTIONLESS DEVICE WITH DRIFT REGION AND THE METHOD FOR MAKING THE SAME

(71) Applicant: Zing Semiconductor Corporation, Shanghai (CN)

(72) Inventor: Deyuan Xiao, Shanghai (CN)

(73) Assignee: ZING SEMICONDUCTOR CORPORATION, Shanghai (CN)

(*) Notice: Subject to any disclaimer, the term of this patent is extended or adjusted under 35 U.S.C. 154(b) by 0 days.

(21) Appl. No.: 15/012,864

(22) Filed: Feb. 2, 2016

(65) Prior Publication Data

US 2017/0133488 A1   May 11, 2017

(30) Foreign Application Priority Data

Nov. 11, 2015 (CN) .......................... 2015 1 0765530

(51) Int. Cl.
  *H01L 29/66* (2006.01)
  *H01L 29/78* (2006.01)
  *H01L 29/20* (2006.01)

(52) U.S. Cl.
  CPC .... *H01L 29/66712* (2013.01); *H01L 29/2003* (2013.01); *H01L 29/7802* (2013.01)

(58) Field of Classification Search
  CPC ............. H01L 29/66795; H01L 29/785; H01L 29/7851
  See application file for complete search history.

(56) References Cited

U.S. PATENT DOCUMENTS

| | | | | |
|---|---|---|---|---|
| 9,123,659 B1* | 9/2015 | Fu | ........................ | H01L 21/3086 |
| 9,362,278 B1* | 6/2016 | Huang | ................ | H01L 27/0886 |
| 2014/0203243 A1* | 7/2014 | Xiao | ................ | H01L 29/66795 257/24 |
| 2014/0335665 A1* | 11/2014 | Basu | ................ | H01L 29/66522 438/157 |
| 2016/0099150 A1* | 4/2016 | Tsai | .................... | H01L 21/2252 257/401 |
| 2016/0181428 A1* | 6/2016 | Chen | .................. | H01L 29/7856 257/401 |
| 2016/0276345 A1* | 9/2016 | Yu | ........................ | H01L 27/0886 |
| 2016/0308128 A1* | 10/2016 | Liu | ..................... | H01L 27/2436 |

* cited by examiner

*Primary Examiner* — Marcos D Pizarro
*Assistant Examiner* — Shannon Yi
(74) *Attorney, Agent, or Firm* — Kilpatrick Townsend & Stockton LLP

(57) ABSTRACT

The present invention discloses a method of forming a high voltage junctionless device with drift region. The drift region formed between the semiconductor channel and the dielectric layer enables the high voltage junctionless device to exhibit higher punch-through voltages and high mobility with better performance and reliability.

17 Claims, 6 Drawing Sheets

HIGH-VOLTAGE JUNCTIONLESS DEVICE WITH DRIFT REGION AND THE METHOD FOR MAKING THE SAME

The present application claims the priority to Chinese Patent Applications No. 201510765530.X, filed with the Chinese State Intellectual Property Office on Nov. 11, 2015, which is incorporated herein by reference in its entirety.

TECHNICAL FIELD

The present invention relates to the field of semiconductor manufacturing and in particular to a high voltage junctionless device with drift region and the method for making the same.

BACKGROUND

As a third generation semiconductor materials typical of wide band gap semiconductor, gallium nitride (GaN) have many properties superior to silicon (Si) materials. GaN is an excellent high frequency, high voltage, high temperature and high power semiconductor material with broad prospective applications in civil and military areas. With advances in GaN technology, in particularly the coming maturity of the large diameter GaN epitaxial growth technology, the commercialization of GaN power semiconductor is expected to be the choice technology solution for high performance low power applications. The GaN power devices have thus attracted the attentions of world leading semiconductor manufacturers and research institutes.

Different from traditional MOSFET, junctionless transistors are formed by source region, channel, drain region, gate oxide layer and gate electrode. The impurity doping type is the same from the source region, channel to the drain region with no PN junction formed. It is a majority carrier conduction type device. The gate bias voltages can modulate the majority carriers in the channel to be either accumulation or depletion which in turn reflects the change of channel conductance and channel current. When the gate bias voltage increases to a level such that the channel near the drain region is depleted of majority carriers, the channel becomes a quasi-infinite resistor and the device is turned off. As the majority carriers are immune to lattice imperfection in the interface between the gate oxide and the semiconductor channel, the interface scattering effects on carriers are also limited. This can result in improved carrier mobility. In addition, because the junctionless transistor is a majority carrier conduction device with high response speed, and the electric field strength along the channel direction near the drain is much lower than the conventional reverse-channel MOS transistor, Therefore, the device's performance and reliability are greatly enhanced.

SUMMARY

The object of the present invention is to provide a method of forming a high voltage junctionless device with drift region and achieve high mobility in the high voltage junctionless device.

To achieve the above object, the present invention provides a method of forming high voltage junctionless device with drift region comprising the following steps:

Providing a substrate for a buffer layer with fin structure to be formed on top of the substrate, A semiconductor channel layer is sequentially deposited on the said buffer layer and the said fin structure surface;

Drift region is formed on both sides of the said fin structure semiconductor channel layer;

A dielectric layer is deposited to cover the said drift region and the exposed semiconductor channel layer;

Forming a metal gate on the surface of the said dielectric layer on both sides of the said fin structure, the thickness of the said metal gate layer is thinner than the height of the said fin structure;

A sidewall is formed on both sides of the exposed dielectric surface of the fin structure and the metal gate;

Sequentially etching off the dielectric layer at the fin structure and the exposed dielectric layer and drift region above the buffer layer surface, exposing the source and drain regions of the semiconductor channel layer;

Doping the exposed source and drain regions to form source and drain;

Formed electrodes on the source and drain respectively.

Continue on further with the description of the method of forming a high voltage junctionless device with drift region, the said buffer layer with fin structure is formed by the following specific steps:

Formed a buffer layer on the said substrate;

Formed patterned photoresist on the buffer layer,

Using patterned photoresist as mask for dry etching to form the fin structure.

Continue on further with the description of method of forming a high voltage junctionless device with drift region, the said buffer layer is made of AlN.

Continue on further with the description of the method of forming a high voltage junctionless device with drift region, the said buffer layer is formed employing MOCVD, ALD or MBE processes.

Continue on further with the description of the method of forming a high voltage junctionless device with drift region, the said channel layer of the semiconductor material is N-type GaN.

Continue on further with the description of the method of forming a high voltage junctionless device with drift region, the semiconductor channel layer is formed by an epitaxial growth process.

Continue on further with the description of the method of forming a high voltage junctionless device with drift region, the material of the said drift region is of silicon oxide or silicon nitride.

Continue on further with the description of the method of forming a high voltage junctionless device with drift region, the said drift region is formed via the following steps:

Form a thin film layer on the surface of said semiconductor channel layer;

By applying chemical mechanical polishing and etch back processes, the thin film layer on both sides of the semiconductor channel surface of the said fin structure is retained, forming a drift region.

Continue on further with the description of the method of forming a high voltage junctionless device with drift region, the said thin film layer is formed by employing ALD, CVD, MOCVD or PVD processes.

Continue on further with the description of the method of forming a high voltage junctionless device with drift region, the said dielectric layer is made of silicon dioxide, aluminum oxide, zirconium oxide or hafnium oxide, Continue on further with the description of the method of forming a high voltage junctionless device with drift region, the said dielectric layer is formed by CVD, MOCVD, ALD, PVD or MBE processes.

Continue on further with the description of the method of forming a high voltage junctionless device with drift region, the said metal gate material is NiAu or CrAu.

Continue on further with the description of the method of forming a high voltage junctionless device with drift region, the said metal layer is formed by using the CVD, PVD, MOCVD, ALD or MBE processes.

Continue on further with the description of the method of forming a high voltage junctionless device with drift region, the said sidewall material is made of silicon nitride.

Continue on further with the description of the method of forming a high voltage junctionless device with drift region, the exposure of the source and drain regions of said semiconductor channel layer is exposed by utilizing a selective etching process successively etched the exposed dielectric layer on the fin structure surface and the buffer layer.

Continue on further with the description of the method of forming a high voltage junctionless device with drift region, using N+ ion implantation or N+ diffusion processes on the semiconductor channel layer to form the source and drain.

In the present invention, it also proposed a high voltage junctionless device with drift region, utilizing any step of the said method of forming a high voltage junctionless device with drift region, including substrate, buffer layer with fin structure, semiconductor channel layer, drift region, dielectric layer, metal gate, sidewall, source, drain, and source and drain electrodes, wherein said fin structure in the buffer layer is formed on said substrate, said semiconductor channel layer formed on the surface of the buffer layer, the said drift region is formed on both sides of the fin structure in the semiconductor channel layer, said dielectric layer is formed on the drift region and the fin structure surface of the semiconductor channel, exposing the semiconductor channel on top of exposed fin structure, the said metal gate is formed on the dielectric layer located on both sides of the fin structure, the sidewall spacer is formed on both sides of the fin structure on both sides of the exposed surface of the dielectric layer and the metal gate, the source electrode is formed in said semiconductor channel layer on both sides of the said metal gate, the said drain electrode is formed in the semiconductor channel layer on top of the fin structure, the said source and drain electrodes formed on the said source and drain regions.

Compared with the prior art, the beneficial effects of the present invention lie mainly in: the proposed method of forming a high voltage junctionless device with drift region, the said drift region formed between the semiconductor channel layer and the dielectric layer enables the high voltage junctionless device to exhibit higher punch-through voltages and high mobility with better performance and reliability.

DETAILED DESCRIPTION

The following shall utilize schematic diagrams to describe in more details the present invention of a high voltage junctionless device with drift region and its method of formation. Although the example can be viewed as a preferred embodiment of the present invention, it should be understood that those skilled in the art can make modifications and still achieving the advantageous effects of the present invention. Thus, the following description should be understood as the general know-how of a skilled person in this field, but not as a limitation to the present invention.

For clarity purpose, not all features of an actual embodiment were described. In the following description, the well-known functions and structures are simplified as too many unnecessary details can cause confusion. In the development of any actual embodiment, a large amount of implementation details are carried out to achieve a specific developmental goal. For example, the embodiment may change according to specific system requirement or commercial limitation. Besides, one should also recognize that the complicated and time consuming development work are simply nothing but routine for a skilled person in this field.

In the following paragraphs, the present invention is described more specifically by utilizing specific examples in reference to the accompanying drawings. According to the following description and claims, advantages and features of the present invention will become more apparent. It should be noted however that the drawings, of simplified version and of approximate dimensions, are meant to facilitate more clearly the description of the embodiment of the present invention.

Figure 1:
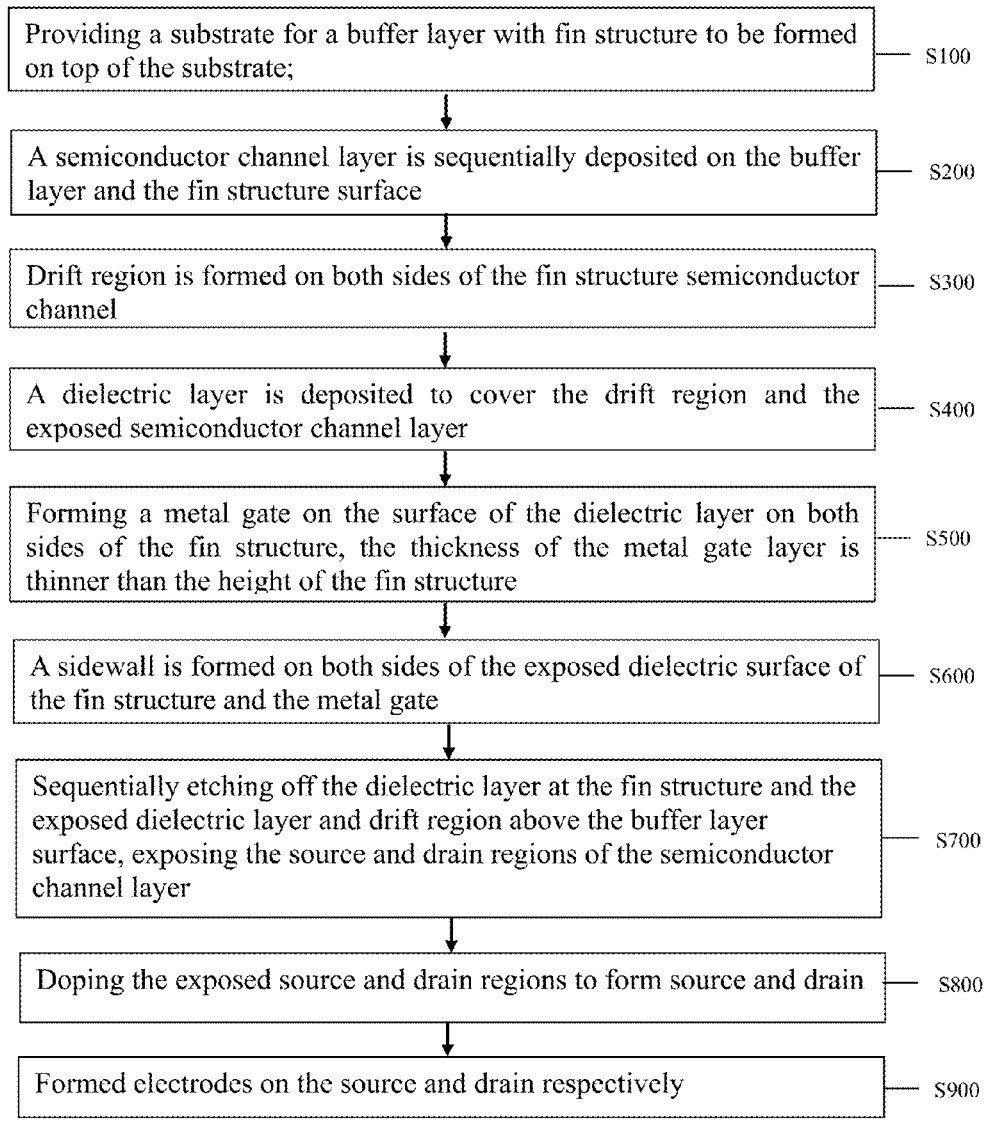
FIG. 1 is a flowchart of present invention describing the embodiment of implementing the method of forming a high voltage junctionless device with drift region.

Please refer to FIG. 1, the present invention proposes the method of forming a high voltage junctionless device with drift region comprising the steps of:

S100: Providing a substrate for a buffer layer with fin structure to be formed on top of the substrate;

S200: A semiconductor channel layer is sequentially deposited on the buffer layer and the fin structure surface;

S300: Drift region is formed on both sides of the fin structure semiconductor channel layer;

S400: A dielectric layer is deposited to cover the drift region and the exposed semiconductor channel layer;

S500: Forming a metal gate on the surface of the dielectric layer on both sides of the fin structure, the thickness of the metal gate layer is thinner than the height of the fin structure;

S600: A sidewall is formed on both sides of the exposed dielectric surface of the fin structure and the metal gate;

S700: Sequentially etching off the dielectric layer at the fin structure and the exposed dielectric layer and drift region above the buffer layer surface, exposing the source and drain regions of the semiconductor channel layer;

S800: Doping the exposed source and drain regions to form source and drain;

S900: Formed electrodes on the source and drain respectively.

Figure 2:
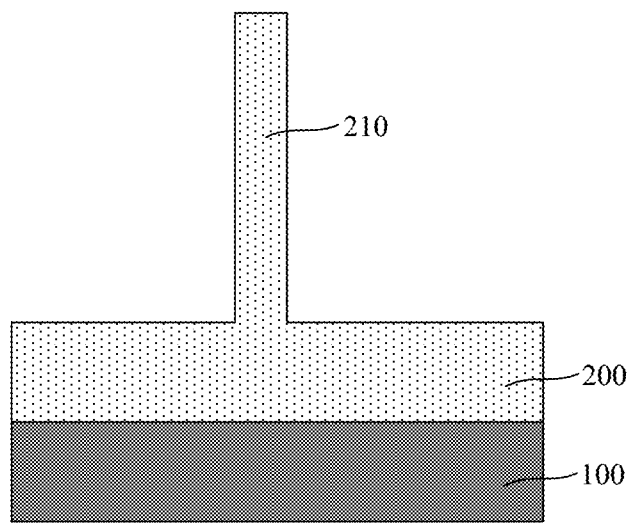
FIGS. 2 through 10 are the cross sectional illustrations of present invention describing the embodiment of implementing the method of forming a high voltage junctionless device with drift region.

Specifically referring to FIG. 2 in step S100, the substrate 100 may be a silicon substrate, a sapphire substrate, a SiC substrate or the like. It may also be the substrate for Σ-type groove shapes.

In the surface of substrate 100 a buffer layer 200 is formed; the material of buffer layer 200 is made of AlN, having a thickness in the range of 100 nm~5000 nm; e.g. 3000 nm. The buffer layer 200 can be formed by MOCVD (Metal-organic Chemical Vapor Deposition), ALD (Atomic Layer Deposition or MBE (Molecular Beam Epitaxy) Processes.

Continue on further, the fin structure 210 is formed on the buffer layer 200 by the following steps:

A buffer layer is formed on the substrate;

Patterned the coated photoresist on the surface of the buffer layer;

Using the patterned photoresist as a mask, dry etching the buffer layer to form a fin structure (Fin) 210.

Figure 3:
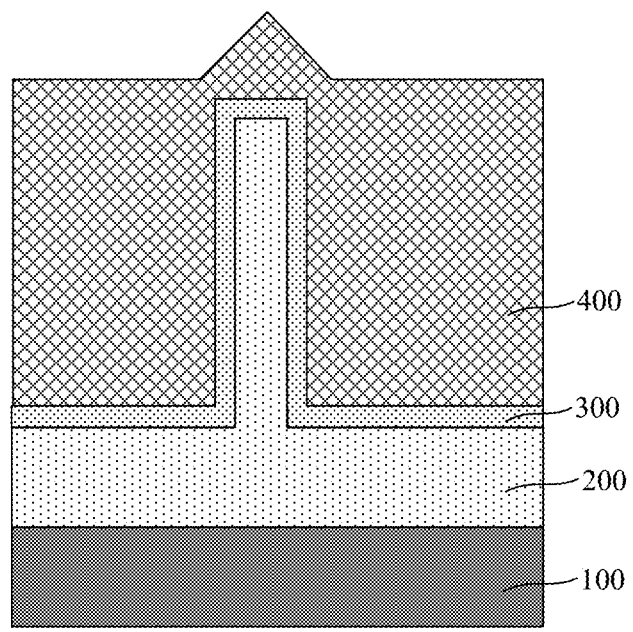

Continue on further and referring to FIG. 3, a semiconductor channel layer 300 is deposited on the surface of the buffer layer 200 and the fin structure 210. The semiconductor channel layer 300 is made of N-type GaN. The thickness in the present embodiment can have a range of 1 nm~100 nm, e.g. 50 nm. The said semiconductor channel layer 300 is formed by epitaxial growth process.

Figure 4:
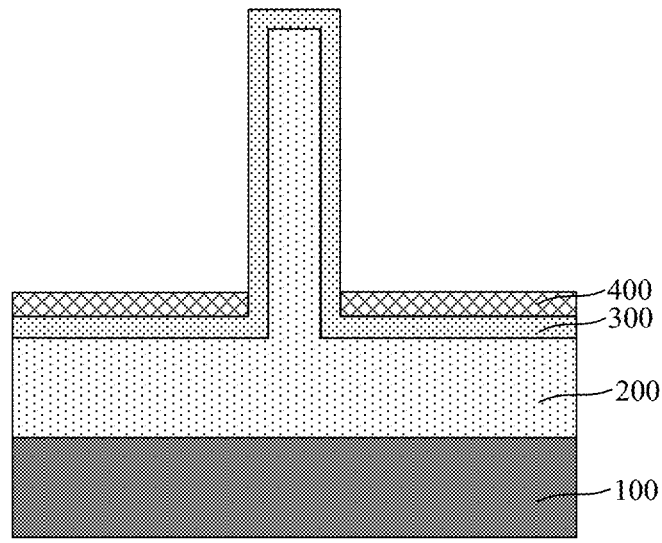

Please continue referring to FIG. 3, a thin film layer 400 is formed on the semiconductor channel layer 300. By applying chemical mechanical polishing (CMP) and etched back (Etch back) processes to the film layer 400, a portion of the thin film layer is retained on the surface of the semiconductor channel layer on both sides of the fin structure 210 thus forming the drift region 410 as shown in FIG. 4. The thin film layer 400 can be deposited by ALD, CVD, MOCVD or PVD (Physical Vapor Deposition) process. The material of the thin film layer 400 may be silicon nitride or silicon oxide. The thickness may be determined according to specific requirements and it is not limited here.

Figure 5:
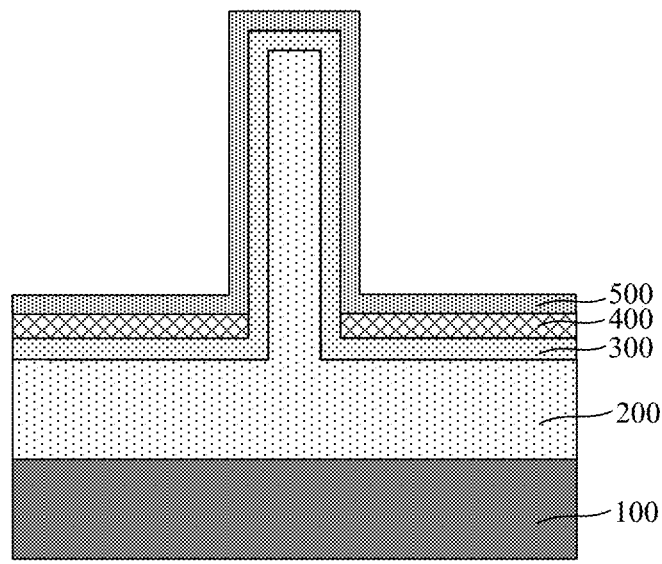

Continue on referring to FIG. 5, a dielectric layer 500 is formed on top of drift region 410 of the exposed semiconductor channel layer 300. The material of the dielectric layer 500 can be silicon dioxide, aluminum oxide, zirconium oxide or hafnium oxide. Its thickness is in the range 1 nm~5 nm, e.g. 3 nm. The dielectric layer 500 can be formed by CVD, MOCVD, ALD or MBE processes.

Figure 6:
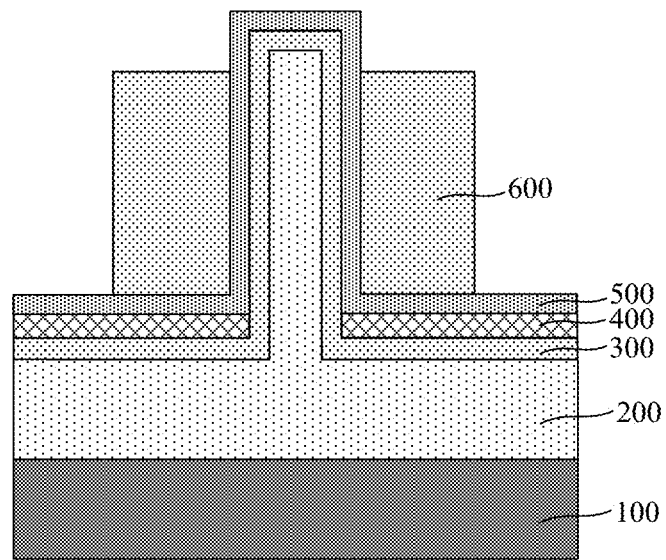

Continue on referring to FIG. 6, metal gate electrode is formed on both sides of the surface of the dielectric layer 500 of the fin structure. The thickness of said metal gate 600 is thinner than the height of the fin structure 210. The said metal gate electrode 600 is made of NiAu or CrAu the like and can be formed by using PVD, MOCVD, ALD or MBE processes.

Figure 7:
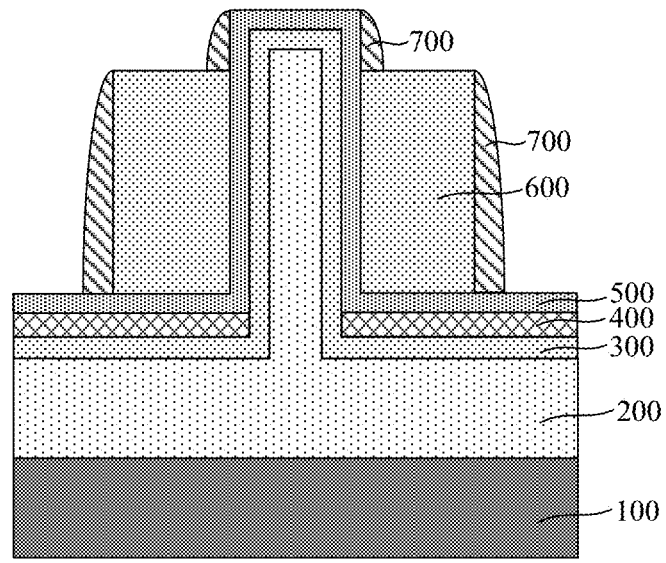

Please refer to FIG. 7, a layer of silicon nitride sidewall 700 is formed on the exposed surface of the dielectric layer 500 at both sides of the fin structure 210 as well as on both sides of the metal gate electrode 600.

Figure 8:
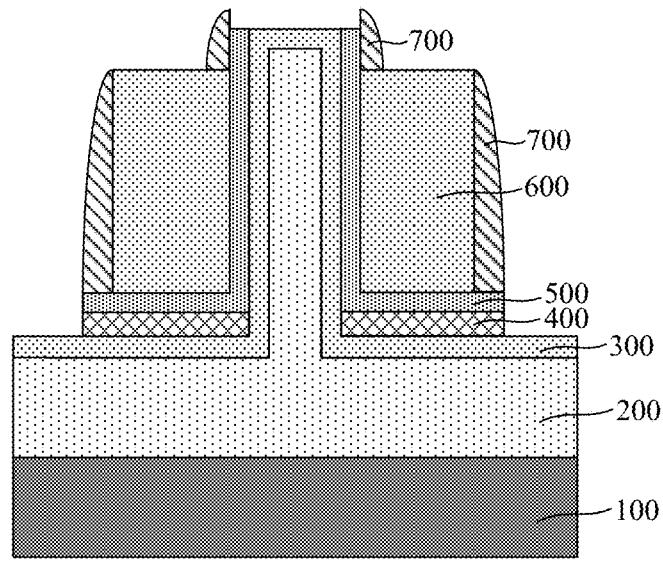

Continue on referring to FIG. 8, utilizing selective etching technique to etch away the dielectric layer 500 on top of the fin structure 210 and the exposed buffer layer 200 and drift region 410. After such etching process, the semiconductor channel layer 300 on top of the fin structure 210 is exposed to be used as the drain region and the channel layer 300 on both sides of the semiconductor gate metal 600 is exposed to be used as the source region.

Figure 9:
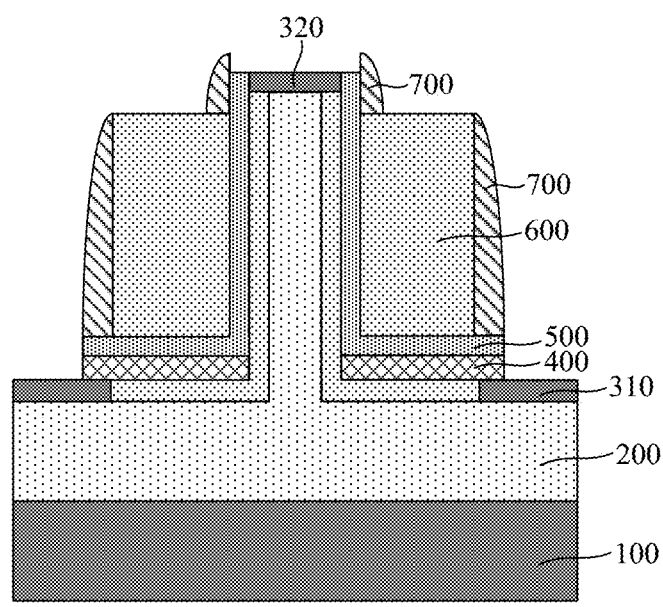

Continue on referring to FIG. 9, the exposed semiconductor channel layer 300 is N+ doped by ion implantation or diffusion process to form source region 310 and drain region 320.

Figure 10:
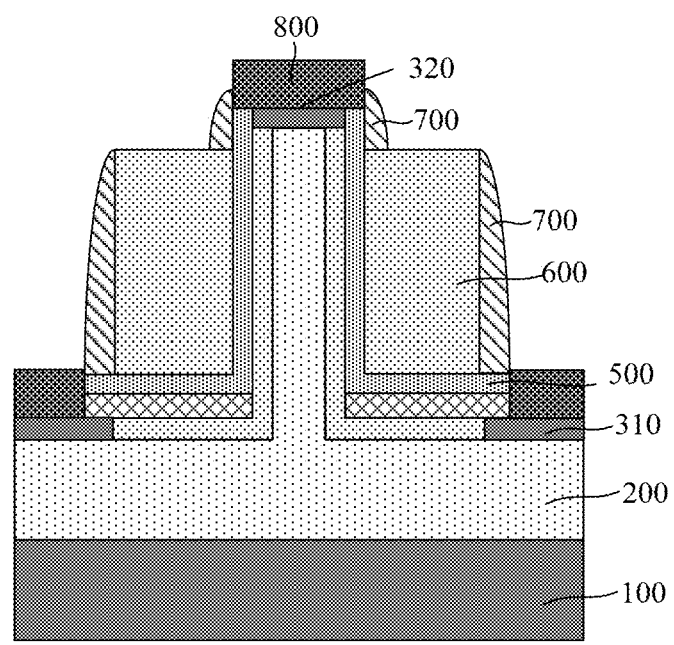

Continue on referring to FIG. 10, electrodes 800 are formed on the source region 310 and drain region 320.

In another aspect of the present embodiment, it has also proposed the forming of a high voltage junctionless device with drift region, utilizing the aforementioned method of forming the high voltage junctionless device with drift region including: substrate 100, buffer layer 200 with fin structure, the semiconductor channel layer 300, the drift region 400, dielectric layer 500, a metal gate 600, sidewall layer 700, source 310, drain 320 and source and drain electrode 800, wherein the fin structure of a buffer layer 200 is formed on the substrate 100, the semiconductor channel layer 300 is formed on the surface of the buffer layer 200, the drift region 410 is formed in the said semiconductor channel layer 300 on both sides of the fin structure 210, the said dielectric layer 500 is formed on the drift region 410 and the surface of the fin structure 210 of the semiconductor channel layer 300, the semiconductor channel layer 300 on top of the fin structure 210 is exposed, a metal gate 600 is formed over dielectric layer 500 on the two sides of the fin structure 210, the sidewall layer 700 is formed on the exposed dielectric layer 500 on both sides of the fin structure 210 and on the two sides of the surface of the metal gate 600, the said source electrode 310 is formed within the semiconductor channel layer 300 located on both sides of the metal gate 600, the drain electrode 320 is formed in the semiconductor channel layer 300 at the top of the fin structure 210. The source and drain electrodes 800 is formed on the source region 310 and the drain region 320.

In summary, in the example embodiment of the present invention which provides a high voltage junctionless device with drift region and its method of formation, also proposed a method of forming a high voltage junctionless device with drift region having the drift region formed between the semiconductor channel layer and the dielectric layer, enabling the high voltage junctionless device to have higher punch through voltages, also high mobility, with better performance and reliability.

The above exemplified the embodiment of the present invention but setting no limitations to it. Any technical person skilled in the art, without departing from the technical scope of the present invention, making equivalent changes or modifications to the disclosed technical scopes and content of the present invention are still within the claims of the present invention.

What is claimed is:

1. A method of forming a high voltage junctionless device with a drift region, the method comprising:
    providing a substrate for a buffer layer with a fin structure to be formed on top of the substrate;
    depositing a semiconductor channel layer on the buffer layer and the fin structure;
    forming the drift region on the semiconductor channel layer on both sides of the fin structure;
    depositing a dielectric layer to cover the drift region and the semiconductor channel layer;
    forming a metal gate on the dielectric layer on both sides of the fin structure, a thickness of the metal gate being thinner than a height of the fin structure, creating an exposed dielectric surface comprising portions of the dielectric layer above the metal gate;
    forming four separate sidewalls including two upper sidewalls and two lower sidewalls, the two upper sidewalls being formed on both sides of the exposed dielectric surface and the two lower sidewalls being formed on both sides of the metal gate;
    etching the exposed dielectric layer surface and a portion of the drift region to expose a top exposed region of the semiconductor channel layer and a side exposed region of the semiconductor channel layer;
    doping the top exposed region of the semiconductor channel layer to form a drain region and the side exposed region of the semiconductor channel layer to form a source region; and
    forming a drain electrode on the drain region and a source electrode on the source region, wherein the drain electrode is coupled on both sides to the two upper sidewalls and is coupled below to the exposed dielectric surface.

2. The method of claim 1, further comprising:
    forming a buffer layer on the substrate;
    forming a patterned photoresist on the buffer layer, and using the patterned photoresist as a mask for dry etching to form the fin structure.

3. The method of claim 1, wherein a semiconductor material of the semiconductor channel layer is N-type GaN.

4. The method of claim 1, wherein a material of the drift region is silicon oxide or silicon nitride.

5. The method of claim 1, wherein the dielectric layer is made of silicon dioxide, aluminum oxide, zirconium oxide or hafnium oxide.

6. The method of claim 1, wherein the metal gate is NiAu or CrAu.

7. The method of claim 1, wherein the four separate sidewalls are made of silicon nitride.

8. The method of claim 1, wherein the exposure of the top exposed region and the side exposed region is characterized by utilizing a selective etching process that successively etches the exposed dielectric layer on the fin structure surface and the buffer layer.

9. The method of claim 1, wherein the source region and the drain region are formed by infusion of N+ ions in the semiconductor channel layer by an ion implantation or an ion diffusion process.

10. The method of claim 2, wherein a buffer layer material characteristic is AlN.

11. The method of claim 2, wherein the buffer layer is formed by MOCVD, ALD or MBE processes.

12. The method of claim 3, wherein the semiconductor channel layer is formed by an epitaxial growth process.

13. The method of claim 4, wherein the drift region is formed by:
    forming a thin film layer on the surface of the semiconductor channel layer; and
    applying chemical mechanical polishing and etch back processes to the thin film layer such that a portion of the thin film layer is retained in the fin structure on both sides of the semiconductor channel layer, forming a drift region.

14. The method of claim 5, wherein the dielectric layer is formed by a CVD, MOCVD, ALD, PVD or MBE processes.

15. The method of claim 6, wherein the metal gate is formed by using CVD, PVD, MOCVD, ALD or MBE processes.

16. The method of claim 13, wherein the thin film layer is formed by using an ALD, CVD, MOCVD or PVD process.

17. A high voltage junctionless device with a drift region comprising:
    a substrate with a buffer layer, a fin structure, a semiconductor channel layer, the drift region, a dielectric layer, a metal gate, four separate sidewalls including two upper sidewalls and two lower sidewalls, a source region, a drain region, a source electrode, and a drain electrode, wherein:
    the fin structure is formed on top of the substrate,
    the semiconductor channel layer is formed on the buffer layer,
    the drift region is formed on the semiconductor channel layer on both sides of the fin structure,
    the dielectric layer is deposited to cover the drift region and the semiconductor channel layer,
    the metal gate is formed on the dielectric layer on both sides of the fin structure, a thickness of the metal gate being thinner than the height of the fin structure, creating an exposed dielectric surface comprising portions of the dielectric layer above the metal gate,
    the two upper sidewalls are formed on both sides of the exposed dielectric surface and the two lower sidewalls are formed on both sides of the metal gate,
    the exposed dielectric layer surface and a portion of the drift region are etched to expose a top exposed region of the semiconductor channel layer and a side exposed region of the semiconductor channel layer,
    the top exposed region of the semiconductor channel layer is doped to form a drain region and the side exposed region of the semiconductor layer is doped to form the source region, and
    the drain electrode is formed on the drain region and the source electrode is formed on the source region, wherein the drain electrode is coupled on both sides to the two upper sidewalls and is coupled below to the exposed dielectric surface.

* * * * *